United States Patent
Tsai et al.

(10) Patent No.: US 9,425,084 B2
(45) Date of Patent: Aug. 23, 2016

(54) MECHANISMS FOR FORMING PROTECTION LAYER ON BACK SIDE OF WAFER

(71) Applicant: Taiwan Semiconductor Manufacturing Co., Ltd., Hsin-Chu (TW)

(72) Inventors: Wen-Shyang Tsai, New Taipei (TW); Wen-Han Tan, Hsinchu (TW); Wen-Lung Ho, Baoshan Township (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/056,438

(22) Filed: Oct. 17, 2013

(65) Prior Publication Data
US 2015/0108633 A1 Apr. 23, 2015

(51) Int. Cl.
| | | |
|---|---|---|
| *H01L 23/12* | (2006.01) | |
| *H01L 21/768* | (2006.01) | |
| *H01L 21/02* | (2006.01) | |
| *H01L 23/31* | (2006.01) | |
| *H01L 21/311* | (2006.01) | |
| *H01L 21/683* | (2006.01) | |
| *H01L 23/29* | (2006.01) | |

(52) U.S. Cl.
CPC .......... *H01L 21/768* (2013.01); *H01L 21/0209* (2013.01); *H01L 21/02071* (2013.01); *H01L 21/31116* (2013.01); *H01L 21/6831* (2013.01); *H01L 23/3171* (2013.01); *H01L 23/291* (2013.01); *H01L 2924/0002* (2013.01)

(58) Field of Classification Search
CPC . H01L 23/535; H01L 21/0209; H01L 21/768; H01L 23/291; H01L 21/02071; H01L 21/6831; H01L 21/3171
USPC .......... 257/701, E23.142, E23.194, 713, 724; 438/68, 113, 127
See application file for complete search history.

(56) References Cited

U.S. PATENT DOCUMENTS

| | | | | |
|---|---|---|---|---|
| 2009/0155984 A1* | 6/2009 | Kim | .................... | H01L 21/561 438/463 |
| 2009/0243074 A1* | 10/2009 | Ramiah | ............... | H01L 21/3065 257/686 |
| 2010/0038802 A1* | 2/2010 | Chen | ................... | H01L 21/8221 257/777 |
| 2013/0143400 A1* | 6/2013 | Farooq | ............... | H01L 21/6835 438/614 |
| 2013/0237004 A1* | 9/2013 | Hynecek | ............... | H01L 23/481 438/70 |
| 2014/0183761 A1* | 7/2014 | Lin | ......................... | H01L 24/11 257/787 |
| 2014/0291787 A1* | 10/2014 | Lan | ......................... | H04R 3/00 257/416 |

\* cited by examiner

*Primary Examiner* — Jarrett Stark
*Assistant Examiner* — Shahed Ahmed
(74) *Attorney, Agent, or Firm* — Birch, Stewart, Kolasch & Birch, LLP

(57) ABSTRACT

Embodiments of mechanisms of forming a semiconductor device structure are provided. The semiconductor device structure is provided. The semiconductor device structure includes a substrate having a front side and a back side. The semiconductor device structure also includes devices formed on the front side of the substrate and interconnect structures formed on the devices. The semiconductor device structure further includes a protection layer formed on the back side of the substrate, and the protection layer has a thickness over about 10 Å.

15 Claims, 7 Drawing Sheets

MECHANISMS FOR FORMING PROTECTION LAYER ON BACK SIDE OF WAFER

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of integrated circuits, photoresist material is placed on top of a semiconductor wafer in desired patterns and is removed afterwards to remove the surrounding material not covered by the resist pattern, in order to obtain the desired features. However, a back side of the wafer may be damaged during removal of the photoresist material over a front side of the wafer. In addition, chuck marks may be formed on the back side of the wafer during various fabrication processes. Therefore, there are many challenges related to protecting the back side of the wafer.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements.

Embodiments of mechanisms for forming a semiconductor device structure are provided. FIGS. 1A-1I show cross-sectional representations of various stages of forming a semiconductor device structure 100 in accordance with some embodiments of the disclosure. However, it should be noted that FIGS. 1A to 1I have been simplified for the sake of clarity to better understand the inventive concepts of the disclosure. Additional features can be added to semiconductor device structure 100, and some of the features below can be replaced or eliminated. In addition, it should be noted that different embodiments may have different advantages than those described herein, and no particular advantage is necessarily required of any embodiment.

Figure 1A:
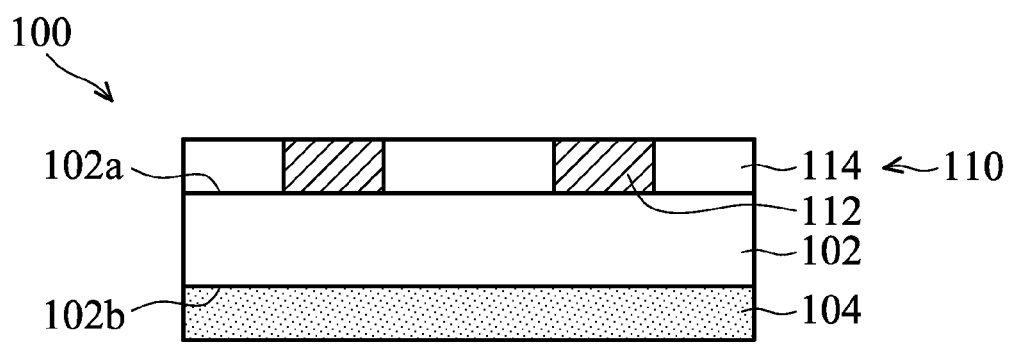
FIGS. 1A-1I show cross-sectional representations of various stages of forming a semiconductor device in accordance with some embodiments of the disclosure.

Referring to FIG. 1A, semiconductor device structure 100 is provided. Semiconductor device structure 100 includes a semiconductor substrate 102. Semiconductor substrate 102 has a front side 102a and a back side 102b. In some embodiments, semiconductor substrate 102 is a wafer, and the wafer has a diameter of about 300 mm.

Semiconductor substrate 102 may be made of silicon or other semiconductor materials. Alternatively or additionally, semiconductor substrate 102 may include other elementary semiconductor materials such as germanium. In some embodiments, semiconductor substrate 102 is made of a compound semiconductor such as silicon carbide, gallium arsenic, indium arsenide, or indium phosphide. In some embodiments, semiconductor substrate 102 is made of an alloy semiconductor such as silicon germanium, silicon germanium carbide, gallium arsenic phosphide, or gallium indium phosphide. In some embodiments, semiconductor substrate 102 includes an epitaxial layer. For example, semiconductor substrate 102 has an epitaxial layer overlying a bulk semiconductor.

Semiconductor substrate 102 may further include isolation features (not shown), such as shallow trench isolation (STI) features or local oxidation of silicon (LOCOS) features. The isolation features may define and isolate various integrated circuit devices. Integrated circuit devices, such as metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements, are formed in and/or on semiconductor substrate 102.

Semiconductor substrate 102 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), imaging sensor, light emitting diode (LED), or other applicable components.

Semiconductor substrate 102 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, or other applicable techniques. The electrode layers may include a single layer or multiple layers, such as metal layer, liner layer, wetting layer, and adhesion layer, formed by ALD, PVD, CVD, or other applicable process.

Semiconductor substrate 102 may also include doped regions (not shown). For example, an ion implantation process is performed to form doped regions in semiconductor substrate 102.

As shown in FIG. 1A, an interconnect structure 110 is formed over semiconductor substrate 102. In some embodiments, interconnect structure 110 is embedded in inter-metal dielectric (IMD) layers 114. Interconnect structure 110 is configured to couple the various p-type and n-type doped regions and the other functional features (such as gate electrodes), resulting a functional integrated circuit. Interconnect structure 110 includes metal lines 114, contacts (not shown) and via features (not shown). Metal lines 114 provide horizontal electrical routing. The contacts provide vertical connection between silicon substrate and metal lines while via features provide vertical connection between metal lines in different metal layers.

In some embodiments, interconnect structure 110 is formed in a back-end-of-line (BEOL) process. Metal lines 114 may be made of conductive material, such as copper (Cu), aluminum (Al), tungsten (W), or applicable materials. In some embodiments, metal lines 114 are copper or copper alloy. In some embodiments, metal lines 114 are formed by single and/or dual damascence processes. Metal lines 114 include multiple metal layers (namely $M_1$, $M_2$, $M_3$ . . . , and Mtop).

As shown in FIG. 1A, an oxide layer 104 is formed on back side 102b of semiconductor substrate 102. The oxide layer 104 is formed in a front-end-of-line (FEOL) process, such as a chemical vapor deposition (CVD), atomic layer deposition (ALD), physical vapor deposition (PVD), or thermal oxidation method. In some embodiments, oxide layer 104 is made of silicon oxide.

Figure 1B:
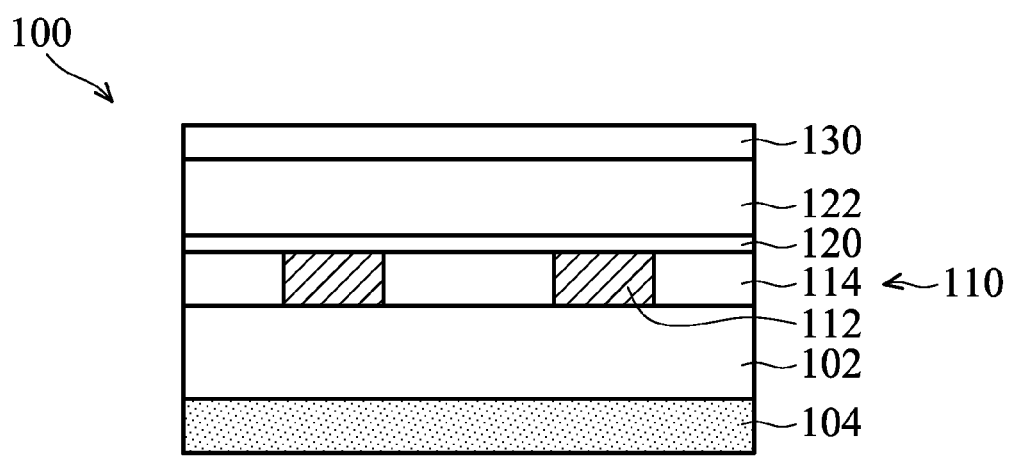

After interconnect structure 110 is formed over semiconductor substrate 102, a liner layer 120 is formed on interconnect structure 110 and a passivation layer 122 is formed on liner layer 120 as shown in FIG. 1B in accordance with some embodiments of the disclosure. Afterwards, a photoresist layer 130 is formed on passivation layer 122. In some embodiments, liner layer 120 is made of silicon nitride. In some embodiments, passivation layer 122 includes multiple layers made of oxide, nitride or oxynitride. In some embodiments, liner layer 120 and passivation layer 122 are formed by a chemical vapor deposition (CVD), atomic layer deposition (ALD), physical vapor deposition (PVD), or other applicable method. In some other embodiments, photoresist layer 130 is formed by a spin coating method.

Figure 1C:
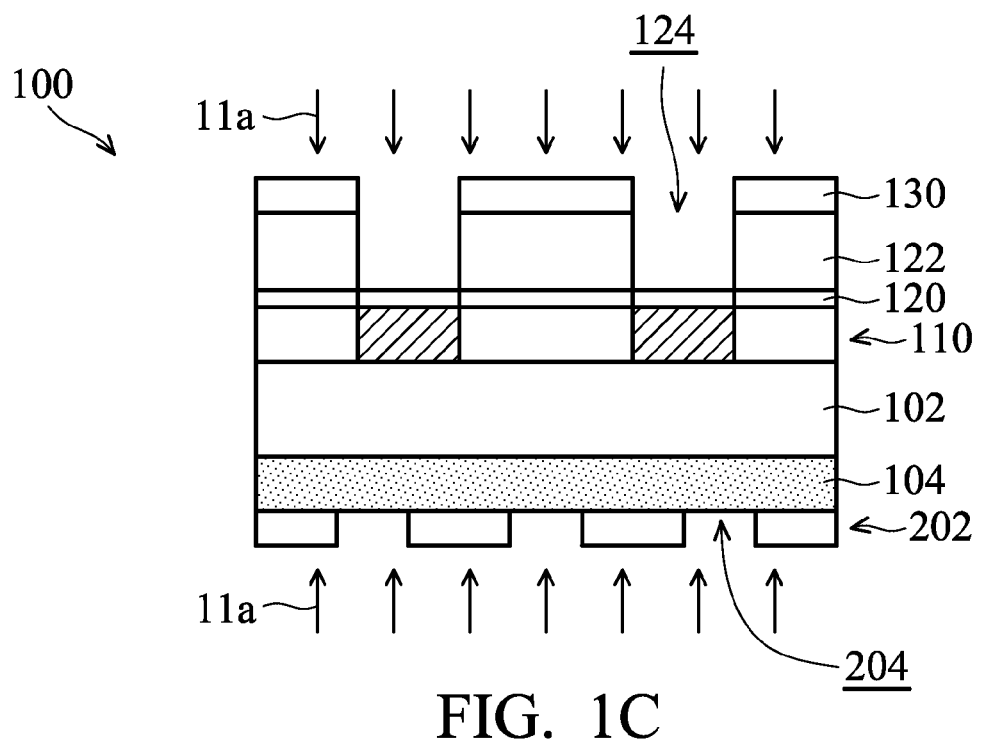

After forming photoresist layer 130, photoresist layer 130 is patterned as shown in FIG. 1C in accordance with some embodiments of the disclosure. Afterwards, passivation layer 122 is patterned to form trenches 124 by using patterned photoresist layer 130 as a mask. Afterwards, patterned photoresist layer 130 is removed by a first dry etching process 11a.

In some embodiments, a dry etching etchant used in first dry etching process 11a includes oxygen ($O_2$), nitrogen ($N_2$) and fluorocarbon gases, such as $CF_4$ or $C_2F_6$. In some embodiments, semiconductor substrate 102 is heated to a temperature at about 200° C. to about 250° C. to perform first dry etching process 11a.

Figure 2:
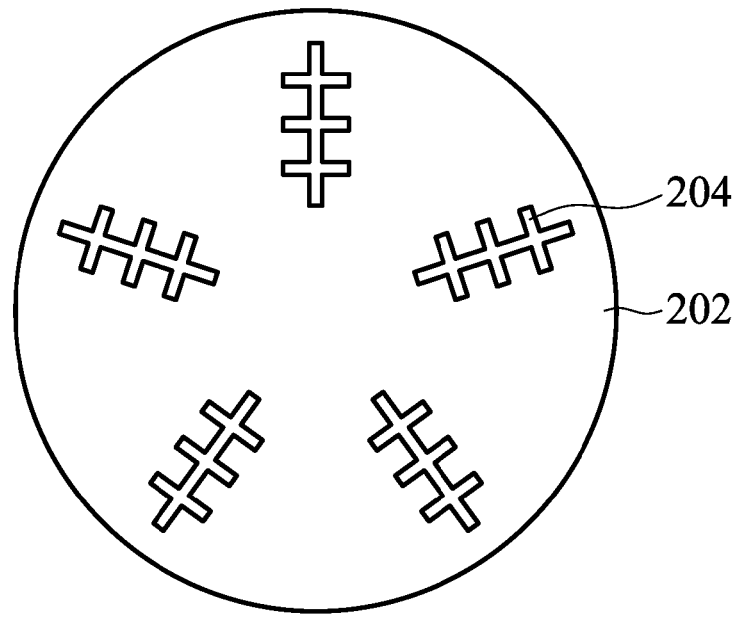
FIG. 2 shows a top-view of a chuck in accordance with some embodiments of the disclosure.

In some embodiments, when performing first dry etching process 11a, semiconductor substrate 102 is disposed on a chuck 202. FIG. 2 shows a top-view of chuck 202 in accordance with some embodiments of the disclosure. In order to secure semiconductor substrate 102 on chuck 202, recesses 204 are formed in chuck 202.

Figure 1D:
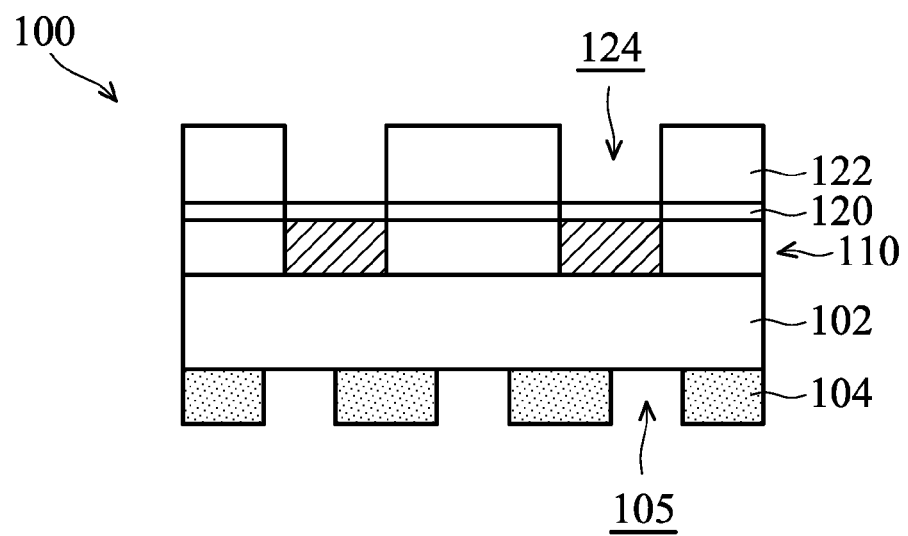

It should be noted that recesses 204 are extending from a top surface of chuck 202 to a bottom surface of chuck 202. Therefore, referring to FIG. 1C again, a dry etching etchant (such as $CF_4$) used in first dry etching process 11a not only etches patterned photoresist layer 130 on front side 102a of semiconductor substrate 102 but also etches oxide layer 104 on back side 102b of semiconductor substrate 102. As a result, a portion of oxide layer 104 is etched by first dry etching process 11a as shown in FIG. 1D in accordance with some embodiments of the disclosure. As shown in FIG. 1D, patterned photoresist layer 130 is removed, but a portion of oxide layer 104 is removed to form openings 105.

Figure 1E:
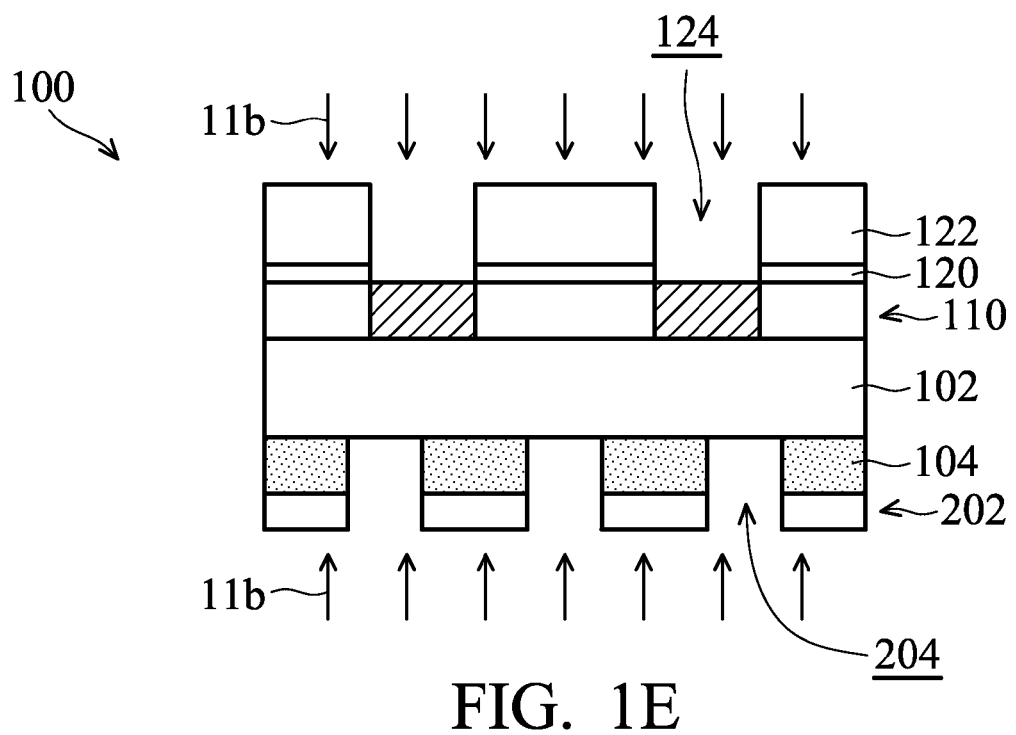

Afterwards, liner layer 120 is removed by an etching process. During the etching process, polymer residues tend to be formed. In order to remove the polymer residues, a second dry etching process 11b is performed as shown in FIG. 1E in accordance with some embodiments of the disclosure. Like FIG. 1C, semiconductor substrate 102 is also disposed on chuck 202 with recesses 204. Therefore, oxide layer 104 is etched again by second dry etching process 11b.

In some embodiments, a dry etching etchant used in second dry etching process 11b includes oxygen ($O_2$), nitrogen ($N_2$) and fluorocarbon gases, such as $CF_4$ or $C_2F_6$. In some embodiments, semiconductor substrate 102 is heated to a temperature at about 80° C. to about 100° C. to perform second dry etching process 11b.

Figure 1F:
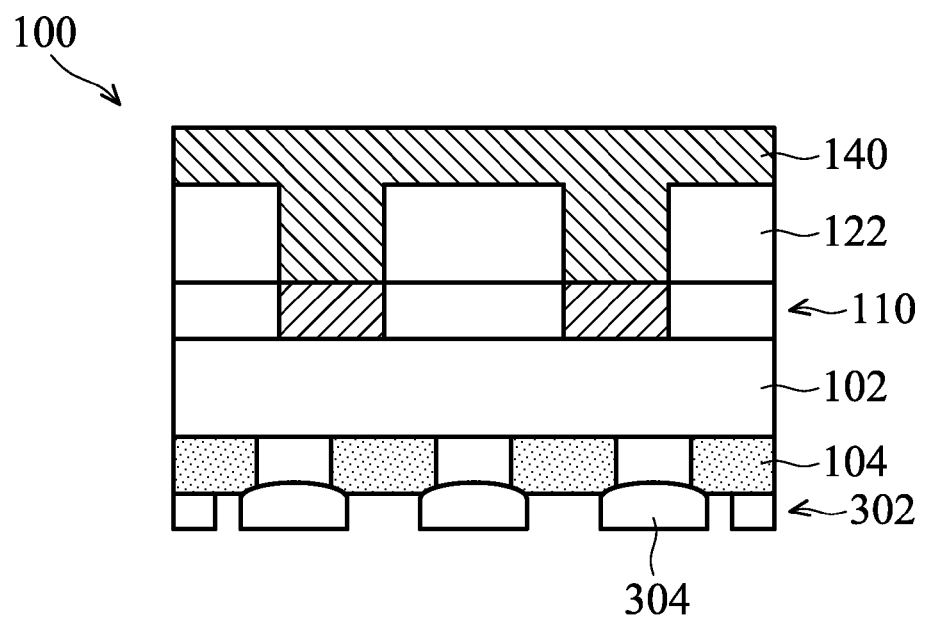

Afterwards, conductive materials 140 are formed on passivation layer 122 and filled into trenches 124 as shown in FIG. 1F in accordance with some embodiments of the disclosure. Conductive materials 140 are made of metal, such as copper (Cu), copper alloy, aluminum (Al), aluminum (Al) alloy, tungsten (W) or tungsten (W) alloy. In some embodiments, conductive materials 140 are formed by a sputter process. During the sputter process, semiconductor substrate 102 is disposed on an electrostatic chuck 302.

Figure 3:
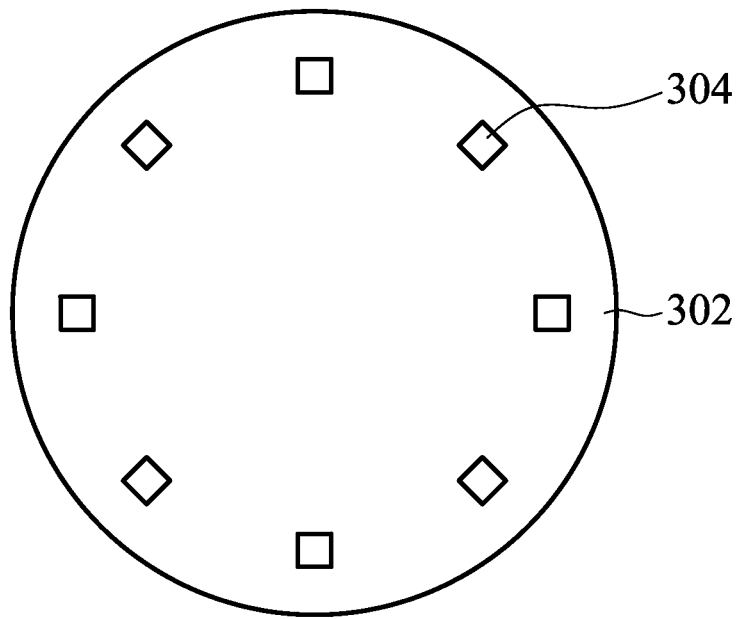
FIG. 3 shows a top-view of an electrostatic chuck in accordance with some embodiments of the disclosure.

FIG. 3 shows a top-view of electrostatic chuck 302 in accordance with some embodiments of the disclosure. In order to increase electrostatic adhesion between semiconductor substrate 102 and electrostatic chuck 302, patterns 304 are formed on electrostatic chuck 302. In some embodiments, patterns 304 include protruding patterns.

As shown in FIG. 1F again, because oxide layer 104 is in direct contact with patterns 304 of electrostatic chuck 302, some chuck marks are formed on a top surface of oxide layer 104.

Figure 1G:
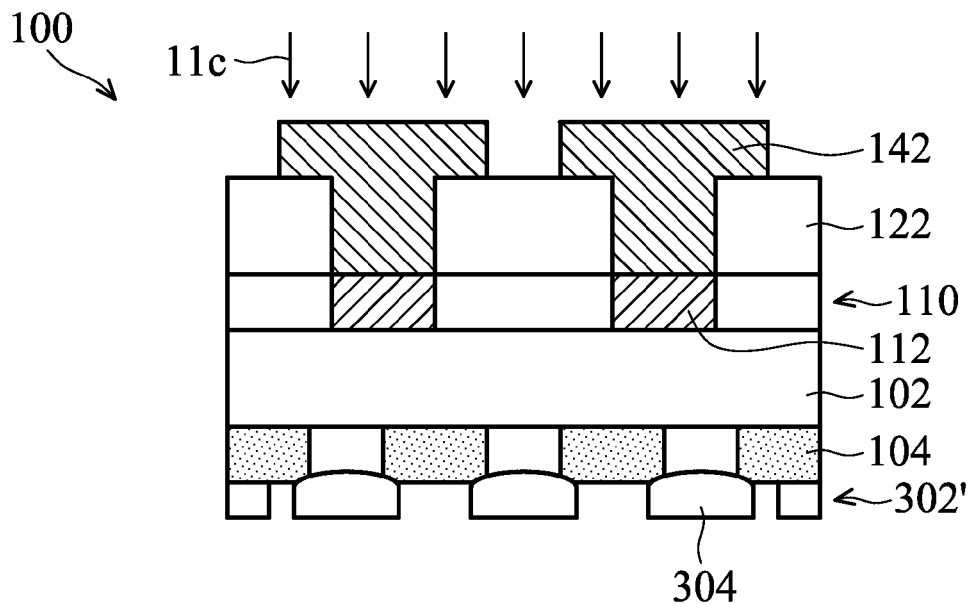

Afterwards, conductive materials 140 are patterned to form conductive structures 142 as shown in FIG. 1G in accordance with some embodiments of the disclosure. Conductive structures 142 are formed on metal lines 112 and electrically connected to metal lines 112. In some embodiments, a photoresist layer (not shown in FIG. 1G) is formed on conductive materials 140 and then patterned to form a patterned photoresist layer. Afterwards, an etching process is performed on the conductive materials 140 by using the patterned photoresist layer as a mask to form conductive structures 142. Afterwards, the patterned photoresist layer is removed by a removing process. However, photoresist residues and polymer residues are formed during the removing process. Therefore, a third dry etching process 11c is performed to remove the photoresist residues and polymer residue.

It should be noted that during third dry etching process 11c, semiconductor substrate 102 is disposed on another electrostatic chuck 302'. Similarly, because oxide layer 104 is in direct contact with patterns 304 of electrostatic chuck 302', some chuck marks are formed on the surface of oxide layer 104.

Figure 4:
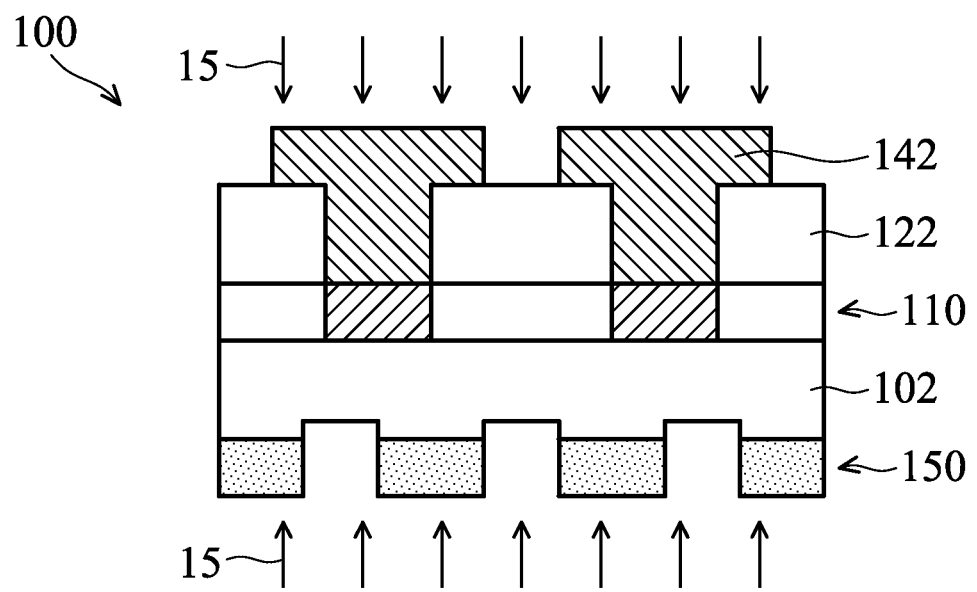
FIG. 4 shows a cross-sectional representation of a semiconductor device when a wet clean process is performed in accordance with some embodiments of the disclosure.

After third dry etching process 11c, in order to completely remove the photoresist residues and polymer residues, a wet cleaning process 15 is performed on semiconductor substrate 102 as shown in FIG. 4 in accordance with some embodiments of the disclosure. It should be noted that oxide layer 104 has been damaged (or removed) by the above processes (such as first dry etching process 11a, second dry etching process 11b, electrostatic chuck 302 and electrostatic chuck 302') and back side 102b of semiconductor substrate 102 has been exposed. As a result, when performing wet cleaning process 15, a portion of semiconductor substrate 102 is etched by a cleaning solution. Therefore, an uneven surface is formed on back side 102b of semiconductor substrate 102. However, the uneven surface may cause undesirable discolor problem.

In some embodiments, the cleaning solution used in wet cleaning process 15 includes amine solution. In some embodiments, the cleaning solution used in wet cleaning process 15 includes monothanolamine (MEA) with a concentration in a range from about 65% to about 75%, dimethyl sulfoxide (DMSO) with a concentration in a range from about 15% to about 30%, and catechol with a concentration in a range from about 2.5% to about 7.5%.

In order to resolve the discolor problem, back side 102b of semiconductor substrate 102 should be planar. Therefore, in some embodiments, a grinding process is performed to planarize back side 102b of semiconductor substrate 102 by removing the oxide layer 104 and a portion of semiconductor substrate 102. However, the grinding process requires expensive instruments, and therefore fabrication time and cost is increased.

Figure 1H:
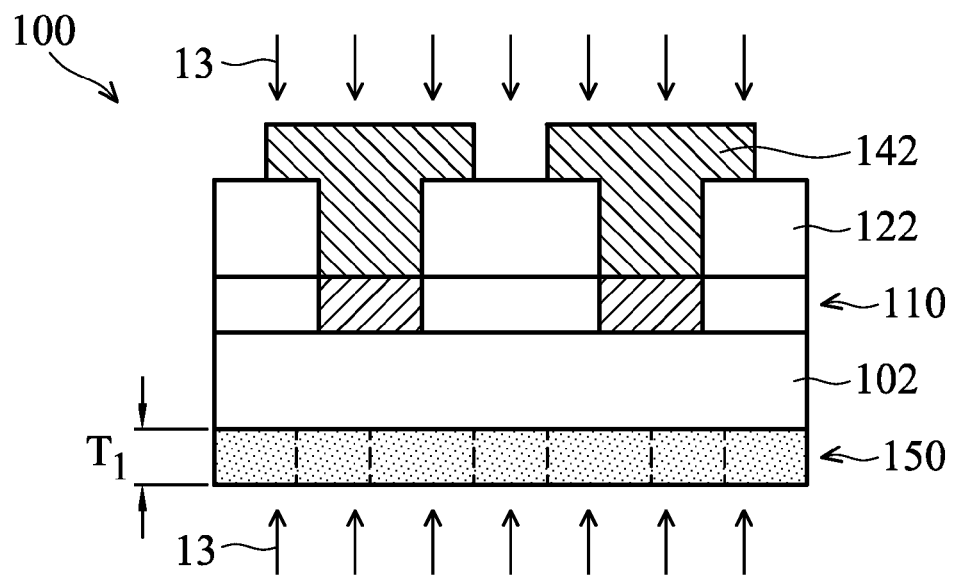

In some embodiments, another process is performed to obtain the substantially planar surface on back side 102b of semiconductor substrate 102. Referring to FIG. 1H, before wet cleaning process 15, a protection layer 150 is formed on back side 102b of semiconductor substrate 102. Protection layer 150 covers the remaining portions of oxide layer 104. In addition, openings 105 (shown in FIG. 1D) in oxide layer 104 are filled with protection layer 150. Protection layer 150 is used to provide a substantially planar surface on back side 102b of semiconductor substrate 102. Furthermore, protection layer 150 protects back side 102b of semiconductor substrate 102 from being etched by wet cleaning process 15.

In addition, openings 105 (shown in FIG. 1D) in oxide layer 104 and chuck mark on the top surface of oxide layer 104 are repaired. In some embodiments, protection layer 150 is difficult to remove by the cleaning solution (such as amine) used in wet cleaning process 15. In other words, when protection layer 150 is etched by the cleaning solution (such as amine), an etching rate of wet cleaning process 15 for protection layer 150 is small.

Protection layer 150 and oxide layer 104 may be made of the same materials. Protection layer 150 includes a single layer or multiple layers. In some embodiments, protection layer 150 is made of oxide, nitride, oxynitride, or tetraethoxysilane (TEOS). A top surface of protection layer 150 is substantially planar, as shown in FIG. 1H. In some embodiments, protection layer 150 has a thickness $T_1$ over about 10 A. In some embodiments, protection layer 150 has a thickness $T_1$ in a range from about 10 A to about 100,000 A.

In some embodiments, a plasma process 13 is performed to form protection layer 150. Plasma process 13 includes oxygen ($O_2$) plasma to form silicon oxide as protection layer 150. In some other embodiments, plasma process 13 includes other plasma to form nitride. In some other embodiments, plasma process 13 is performed at a temperature in a range from about 200° C. to about 250° C. In some other embodiments, the plasma used in plasma process 13 provides a pressure in a range from about 350 mtor to about 1000 mtorr.

When oxygen ($O_2$) plasma is performed to semiconductor substrate 102, front side 102a and back side 102b both come into contact with the oxygen ($O_2$) plasma. The photoresist residues and polymer residues remaining on front side 102a from the above processes are removed by the oxygen ($O_2$) plasma. The oxygen ($O_2$) plasma provides a re-cleaning method to front side 102a of semiconductor substrate 102.

Figure 1I:
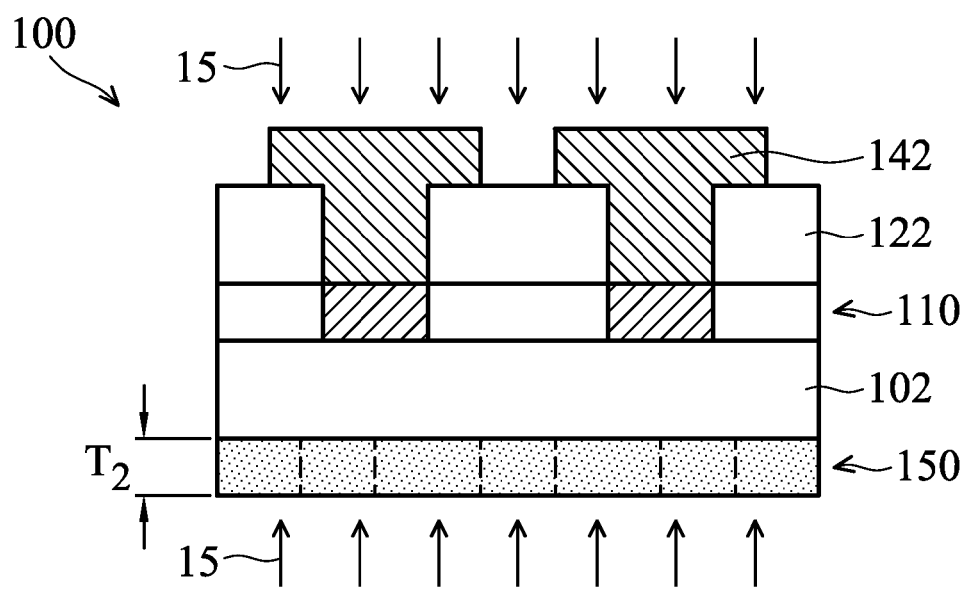

After protection layer 150 is formed over back side 102b of semiconductor substrate 102, the wet cleaning process 15 is performed as shown in FIG. 1I in accordance with some embodiments of the disclosure. As mentioned above, the cleaning solution has a lower etching rate to protection layer 150 than semiconductor substrate 102. Therefore, protection layer 150 is used to protect semiconductor substrate 102 from being etched.

After wet cleaning process 15, protection layer 150 is slightly etched by the cleaning solution (such as amine). Although the thickness of protection layer 150 is decreased from $T_1$ to $T_2$, the thickness $T_2$ is still thick enough to protect semiconductor substrate 102 from being etched. Furthermore, protection layer 150 still has a substantially planar top surface.

Figure 5:
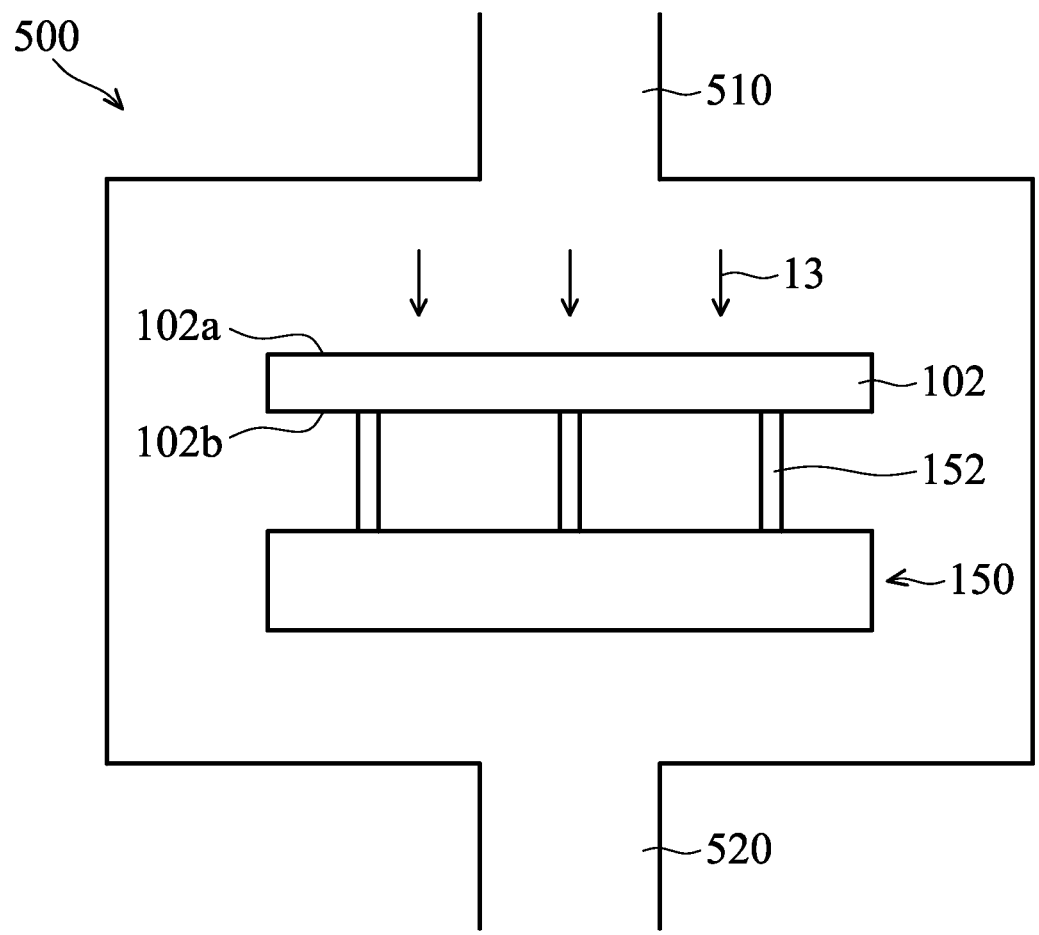
FIG. 5 shows a cross-sectional representation of a plasma chamber in accordance with some embodiments of the disclosure.

FIG. 5 shows a cross-sectional representation of a plasma chamber 500 in accordance with some embodiments of the disclosure. Semiconductor substrate 102 is disposed in plasma chamber 500 and over a chuck 150. Plasma chamber 500 includes an input port 510 and an exhaust port. Input port 510 is used to provide plasma to plasma chamber 500 and exhaust port 520 is used to exclude the exhaust gas.

As shown in FIG. 5, back side 102b of semiconductor substrate 102 faces chuck 150. It should be noted that pins 152 are formed between semiconductor substrate 102 and chuck 150, and therefore semiconductor substrate 102 does not directly come into contact with the chuck 150. Since back side 102b of semiconductor substrate 102 does not come into contact with chuck 150, no chuck marks are formed on back side 102b of semiconductor substrate 102. In addition, protection layer 150 has no chuck marks.

As mentioned above, if no protection layer 150 is formed on back side 102b of semiconductor substrate 102, back side 102b has an uneven surface due to a portion of oxide layer 104 having been etched. The uneven surface may cause discolor problem. Protection layer 150 is easy to form on back side 102b by plasma process 13 to obtain a substantially planar surface. Compared to using a grinding process, the fabrication time and cost of using plasma process 13 is relatively low.

Moreover, if no protection layer 150 is formed on back side 102b of semiconductor substrate 102 before wet clean process 15, back side 102b of semiconductor substrate 102 is etched by wet clean process 15. However, since protection layer 150 is formed on back side 102b of semiconductor substrate 102, damage to semiconductor substrate 102 is avoided.

Embodiments of mechanisms for forming a protection layer on a back side of a substrate are provided. A protection layer is formed on the back side of the substrate to obtain a substantially planar surface. Therefore, the discolor problems due to an uneven surface are resolved. In addition, the protection layer protects the back side of the substrate from being etched. The protection layer is easily fabricated by performing a plasma process. Therefore, fabrication time and cost are reduced.

In some embodiments, a semiconductor device structure is provided. The semiconductor device structure includes a substrate having a front side and a back side. The semiconductor device structure also includes devices formed on the front side of the substrate and interconnect structures formed on the devices. The semiconductor device structure further includes a protection layer formed on the back side of the substrate, and the protection layer has a thickness over about 10 A.

In some embodiments, a method for forming a semiconductor device structure is provided. The semiconductor device structure includes providing a substrate having a front side and a back side and forming devices on the front side of the substrate. The method also includes forming a protection layer on the back side of the substrate, and the protection layer has a thickness over about 10 A. The method further includes cleaning the substrate.

In some embodiments, a method for forming a semiconductor device structure is provided. The method includes providing a substrate having a front side and a back side and forming a passivation layer on the front side of the substrate. The method also includes forming a patterned photoresist layer on the passivation layer and patterning the protection layer to form a trench in the passivation layer. The method further includes removing the patterned photoresist layer and forming a conductive structure in the trench and on the passivation layer. The method includes forming a protection layer on the back side of the substrate and cleaning the substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
    a substrate having a front side and a back side, wherein the substrate is a wafer;
    devices formed on the front side of the substrate;
    interconnect structures formed on the devices; and
    a protection layer formed on the back side of the substrate, wherein the protection layer has a thickness over about 10 A, the protection layer is made of oxide, nitride or oxynitride, and the protection layer is formed on the backside of the wafer, and the back side of the wafer is completely covered by the protection layer, and an oxide layer with a plurality of openings is formed on and below the back side of the wafer, the plurality of openings face downward and away from the back side of the wafer, and the protection layer is formed within the openings of the oxide layer and further below the oxide layer.

2. The semiconductor device structure as claimed in claim 1, wherein the protection layer has no chuck marks.

3. The semiconductor device structure as claimed in claim 1, wherein a top surface of the protection layer is substantially planar.

4. The semiconductor device structure as claimed in claim 1, wherein the protection layer comprises a single layer or multiple layers.

5. The semiconductor device structure as claimed in claim 1, wherein the interconnect structures comprise metal lines formed in a dielectric layer.

6. The semiconductor device structure as claimed in claim 1, wherein the back side of the substrate has no chuck marks.

7. The semiconductor device structure as claimed in claim 1, wherein the substrate has a diameter of about 300 mm.

8. The semiconductor device structure as claimed in claim 1, wherein the protection layer is made of silicon oxide.

9. The semiconductor device structure as claimed in claim 1, wherein the protection layer has a thickness in a range from about 10 A to about 100,000 A.

10. The semiconductor device structure as claimed in claim 1, wherein the protection layer is configured to protect the substrate from being etched.

11. The semiconductor device structure as claimed in claim 1, wherein the protection layer is configured to protect the back side of the substrate from being etched.

12. The semiconductor device structure as claimed in claim 1, wherein the protection layer is formed by a plasma process.

13. The semiconductor device structure as claimed in claim 12, wherein the plasma process comprises using an oxygen ($O_2$) plasma.

14. The semiconductor device structure as claimed in claim 12, wherein the plasma process is performed at a temperature in a range from about 200° C. to about 250° C.

15. The semiconductor device structure as claimed in claim 12, wherein the plasma process is performed at a pressure in a range from about 350 mtorr to about 1000 mtorr.

* * * * *